(12) United States Patent
Rostalski et al.

(10) Patent No.: US 9,291,751 B2
(45) Date of Patent: Mar. 22, 2016

(54) IMAGING OPTICAL UNIT AND PROJECTION EXPOSURE APPARATUS FOR PROJECTION LITHOGRAPHY COMPRISING SUCH AN IMAGING OPTICAL UNIT

(71) Applicant: Carl Zeiss SMT GmbH, Oberkochen (DE)

(72) Inventors: Hans-Juergen Rostalski, Oberkochen (DE); Sascha Migura, Aalen-Unterrombach (DE); Thomas Schicketanz, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 249 days.

(21) Appl. No.: 13/919,500

(22) Filed: Jun. 17, 2013

(65) Prior Publication Data

US 2014/0368801 A1 Dec. 18, 2014

(51) Int. Cl.
*G03B 27/54* (2006.01)
*G03B 27/72* (2006.01)
*G02B 5/08* (2006.01)
*G03F 7/20* (2006.01)
*G02B 17/06* (2006.01)

(52) U.S. Cl.
CPC .......... *G02B 5/0891* (2013.01); *G02B 17/0663* (2013.01); *G03F 7/70091* (2013.01); *G03F 7/70233* (2013.01)

(58) Field of Classification Search
CPC .......................... G03F 7/70091; G03F 7/70425
USPC ..................................... 355/66–71
See application file for complete search history.

(56) References Cited

U.S. PATENT DOCUMENTS

| 2007/0058269 A1 | 3/2007 | Mann et al. | |
| 2009/0027644 A1 | 1/2009 | Zellner et al. | |
| 2010/0265481 A1 | 10/2010 | Mann et al. | |
| 2013/0070227 A1* | 3/2013 | Mueller et al. | 355/67 |
| 2013/0250265 A1* | 9/2013 | Bienert et al. | 355/71 |
| 2014/0071418 A1* | 3/2014 | Wolf | 355/67 |

FOREIGN PATENT DOCUMENTS

| DE | 199 23 609 A1 | 12/1999 |
| DE | 10 2008 033 341 | 1/2009 |
| DE | 10 2007 051 671 A1 | 5/2009 |
| DE | 10 2012 202 675 | 1/2013 |
| WO | WO 2009/024164 A1 | 2/2009 |
| WO | WO 2010/091800 A1 | 8/2010 |

OTHER PUBLICATIONS

Office Action for German patent application 10 2012 202 675.4, and English language translation thereof, dated May 9, 2012.

* cited by examiner

*Primary Examiner* — Hung Henry Nguyen
(74) *Attorney, Agent, or Firm* — Fish & Richardson P.C.

(57) ABSTRACT

An imaging optical unit (7) serves for imaging an object field (4) in an object plane (5) into an image field (8) in an image plane (9). The imaging optical unit (7) has a plurality of components (M1 to M6, GI) which guide imaging light (3). The imaging optical unit (7) is embodied as a pupil-obscured system. The imaging optical unit (7) has at least one mirror (GI) for grazing incidence of the imaging light (3). The result is an imaging optical unit having a handleable combination of low imaging aberrations and compact construction.

20 Claims, 3 Drawing Sheets

IMAGING OPTICAL UNIT AND PROJECTION EXPOSURE APPARATUS FOR PROJECTION LITHOGRAPHY COMPRISING SUCH AN IMAGING OPTICAL UNIT

The invention relates to an imaging optical unit for imaging an object field in an object plane into an image field in an image plane. Furthermore, the invention relates to an optical system comprising such an imaging optical unit, a projection exposure apparatus comprising such an optical system, a method for producing a micro- or nanostructured component with such a projection exposure apparatus, and a micro- or nanostructured component produced by this method.

Imaging optical units of the type mentioned in the introduction are known from WO 2010/091800 A1 and WO 2009/024164 A1.

It is an object of the present invention to develop an imaging optical unit of the type mentioned in the introduction in such a way that a handleable combination of low imaging aberrations and compact construction is achieved.

This object is achieved according to the invention via an imaging optical unit for imaging an object field in an object plane into an image field in an image plane. The imaging optical unit includes a plurality of components which guide the imaging light. The imaging optical unit is a pupil-obscured system, and the imaging optical unit includes at least one mirror for grazing incidence of the imaging light.

The combination according to the invention of a pupil-obscured system with at least one mirror for grazing incidence makes possible a compact imaging optical unit in which the mirror for grazing incidence, on account of its folding effect for the imaging light, can lead to an even more compact system. Throughput losses at the mirror for grazing incidence are low since higher reflectivities can be achieved there in comparison with other mirrors. This advantage is manifested particularly when imaging light having a very short wavelength, for example imaging light in the range of EUV (Extreme Ultraviolet) wavelengths, is used. The mirror for grazing incidence can be used for additional imaging aberration correction and can be shaped as correction element in this regard. The number of further optical components of the imaging optical unit can be small. By way of example, six further optical components, in particular six further mirrors, can also be used alongside the mirror for grazing incidences. A reflection surface of the mirror for grazing incidence can lie in a plane, wherein the mid points of all the optical components of the imaging optical unit become situated on the same side of the plane. This can foster the compactness of the imaging optical unit. Four or eight further optical components can also be used.

An angle of incidence on the mirror for grazing incidence, for all individual rays of the imaging light, can be at least 70°, can be at least 75°, can be at least 80°, can be at least 85° or can also be at least 88°. The imaging optical unit can have two mirrors for grazing incidence of the imaging light.

An arrangement of the mirror for grazing incidence in the imaging beam path of the imaging optical unit between two further optical components which guide the imaging light makes possible a particularly compact folding of the imaging beam path.

A near-field arrangement of the mirror for grazing incidence in the imaging beam path of the imaging optical unit makes it possible to embody this mirror with a relatively small reflection surface, since the mirror for grazing incidence is then arranged in the region of a relatively narrowly guided imaging beam of the imaging optical unit. The mirror for grazing incidence can be arranged in the region of an intermediate image plane of the imaging optical unit. The arrangement is near-field when a pupil parameter P for the mirror is less than 0.4. The pupil parameter P is defined in WO 2009/024164 A1, for example.

A compensation element having a pupil-dependent throughput profile for the imaging light makes it possible to compensate for differences in reflectivity at the mirror for grazing incidence. A pupil-dependent throughput profile for the imaging light is present when the imaging light is influenced depending on that location on a pupil of the imaging optical unit through which the imaging light passes, that is to say depending on a pupil coordinate. The term throughput denotes the transmission of transmissive components or the reflection of reflective components of the components of the imaging optical unit which guide the imaging light. A specifically designed reflection coating, a neutral filter, a roughness variation on one of the components which guides the imaging light, for example on a near-pupil mirror, can be used as compensation element. An optical component is near-pupil when P>0.6 holds true for the pupil parameter P.

A freeform reflection surface of the mirror for grazing incidence makes possible an imaging aberration correction with the aid of the mirror for grazing incidence. Alternatively or additionally, the mirror for grazing incidence can also be used for field shaping.

A catoptric optical unit allows the use of short-wave imaging light for which transmissive optical materials cannot readily be made available. The mirrors of the imaging optical unit can bear a multilayer reflection coating.

A maximum angle of incidence of the imaging light on those mirrors on which the imaging light is incident in a non-grazing fashion of at most 25° leads to an optimized throughput of the imaging optical unit. Those mirrors on which the imaging light is incident in a non-grazing fashion are also designated hereinafter as NI mirrors. The maximum angle of incidence on the NI mirrors can be at most 25° and can be for example 22°, 20°, 18° or 16°.

In some embodiments, at least one mirror for grazing incidence is arranged such that the imaging light impinges with different angles of incidence on the mirror for grazing incidence. At least one of the further mirrors of the imaging optical unit is embodied as a compensation mirror such that imaging light rays which are reflected by the mirror for grazing incidence with lower reflectivity than other imaging rays are reflected by the compensation mirror with higher reflectivity than the other imaging rays. Such a reflectivity compensation leads to the intensity conditions being made more uniform over the image field.

The same correspondingly applies to a multilayer reflectivity coating or multilayer reflection coating of the at least one compensation mirror for which the layer thickness distribution varies over a reflection surface of the compensation mirror. As an alternative or in addition to such a multilayer reflection coating, the imaging optical unit can be designed such that a bandwidth of angles of incidence of the imaging light occurs on the compensation element or on the compensation mirror. The compensation mirror is then operated such that imaging light rays which are reflected by the mirror for grazing incidence with lower reflectivity than other imaging rays are reflected by the compensation mirror with higher reflectivity than the other imaging light rays on account of a dependence of the compensation mirror reflectivity on the angle of incidence. The dependence of the compensation mirror reflectivity R on the angle α of incidence can be predefined or supported by choosing a corresponding reflectivity coating, in particular a multilayer reflectivity coating. By way of example, the compensation mirror can be operated in a slope of an R(α) dependence of the multilayer reflectivity coating, that is to say in a slope of the dependence of the reflectivity on the angle of incidence.

The advantages of an optical system including the imaging optical unit, a projection exposure apparatus including the imaging optical unit, a production method using the imaging optical unit, and a micro- or nanostructured component made by such a method correspond to those which have already been explained above with reference to the imaging optical unit according to the invention.

The light source of the projection exposure apparatus can be embodied in a broadband fashion and can have for example a bandwidth which is greater than 1 nm, which is greater than 10 nm or which is greater than 100 nm. Moreover, the projection exposure apparatus can be embodied such that it can be operated with light sources having different wavelengths. Light sources for other wavelengths, used in particular for microlithography, can also be used in connection with the imaging optical unit according to the invention, for example light sources having the wavelengths 365 nm, 248 nm, 193 nm, 157 nm, 126 nm, 109 nm and in particular also having EUV wavelengths which are less than 100 nm, for example between 5 nm and 30 nm.

The light source of the projection exposure apparatus can be designed for generating EUV illumination light having a wavelength of between 5 nm and 30 nm. Such a light source requires reflection coatings on the mirrors which, in order to fulfill a minimum reflectivity, have only a small angle of incidence acceptance bandwidth. This requirement for a small angle of incidence acceptance bandwidth can be fulfilled together with the imaging optical unit according to the invention.

An exemplary embodiment of the invention is explained in greater detail below with reference to the drawing, in which:

FIG. 1 schematically shows a projection exposure apparatus for EUV microlithography;

A projection exposure apparatus 1 for microlithography has a light source 2 for illumination light or imaging light 3. The light source 2 is an EUV light source which generates light in a wavelength range of, for example, between 5 nm and 30 nm, in particular between 5 nm and 15 nm. The light source 2 can be, in particular, a light source having a wavelength of 13.5 nm or a light source having a wavelength of 6.9 nm. Other EUV wavelengths are also possible. In general, even arbitrary wavelengths, for example visible wavelengths or else other wavelengths which can be used in microlithography and for which suitable laser light sources and/or LED light sources are available (for example 365 nm, 248 nm, 193 nm, 157 nm, 129 nm, 109 nm), are possible for the illumination light 3 guided in the projection exposure apparatus 1. A beam path of the illumination light 3 is illustrated extremely schematically in FIG. 1.

Figure 2:
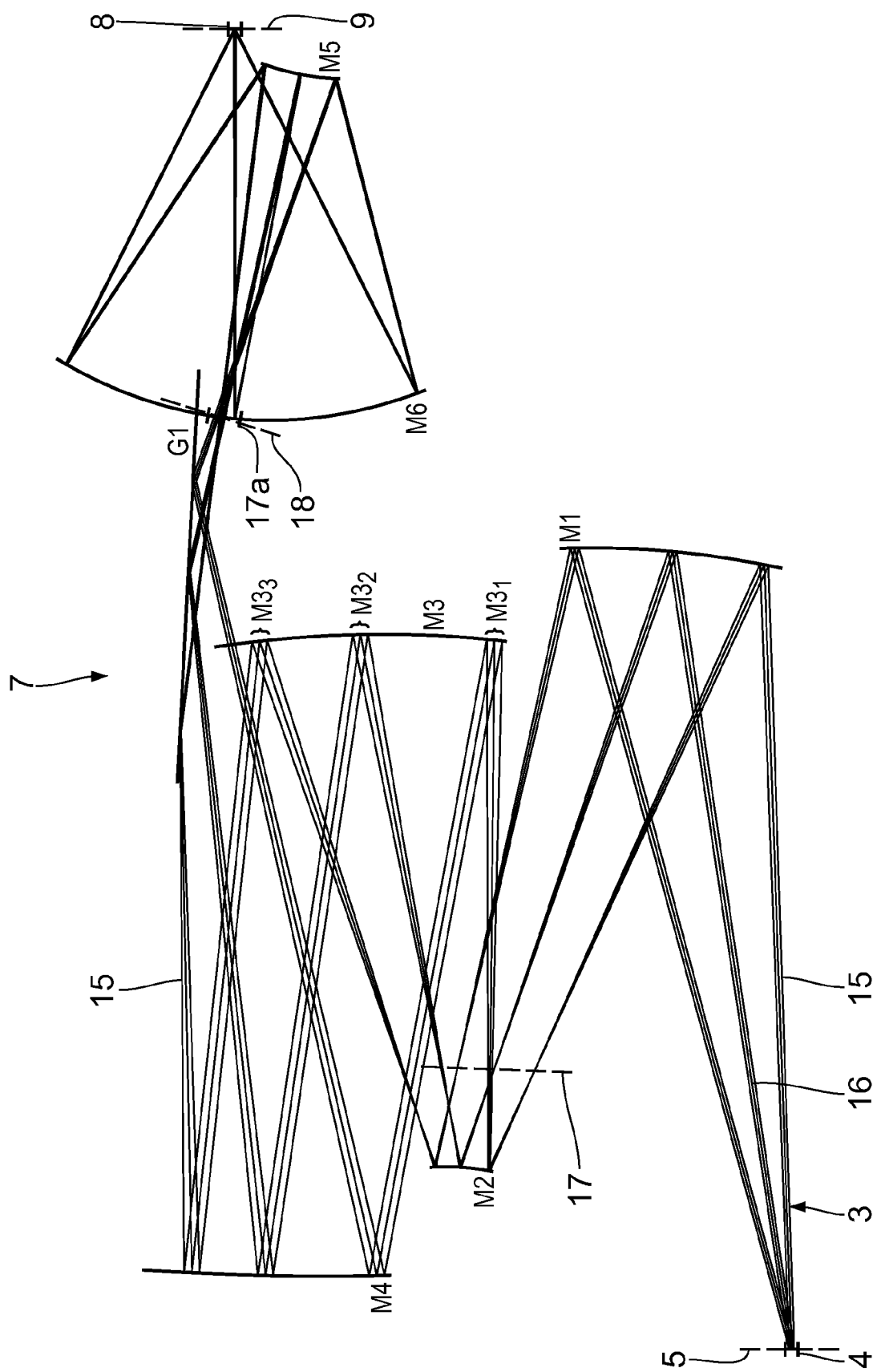
FIG. 2 shows, in a meridional section, an embodiment of an imaging optical unit which can be used as a projection lens in the projection exposure apparatus according to FIG. 1, wherein the imaging beam path for the chief rays (obscured) and for the upper and lower coma rays of three selected field points is illustrated.

An illumination optical unit 6 serves for guiding the illumination light 3 from the light source 2 toward an object field 4 in an object plane 5. Via a projection optical unit or imaging optical unit 7, the object field 4 is imaged into an image field 8 in an image plane 9 with a predefined reduction scale. The image field 8 has an extent of 26 nm in the x-direction and an extent of 2 mm in the y-direction. The object field 4 and the image field 8 are rectangular. Alternatively, the object field 4 and the image field 8 can also be embodied as parts or as sections of a ring. The exemplary embodiment illustrated in FIG. 2 is used for the projection optical unit 7. The projection optical unit 7 is a pure mirror optical unit, that is to say a catoptric imaging optical unit.

The projection optical unit 7 according to FIG. 2 reduces by a factor of 4. Other reduction scales are also possible, for example 5×, 8× or even reduction scales that are greater than 8×. In the case of the projection optical unit 7, the image plane 9 is arranged parallel to the object plane 5. In this case, a segment of a reflection mask 10, which is also designated as a reticle, the segment coinciding with the object field 4, is imaged. The reticle 10 is carried by a reticle holder 10a.

Figure 1:
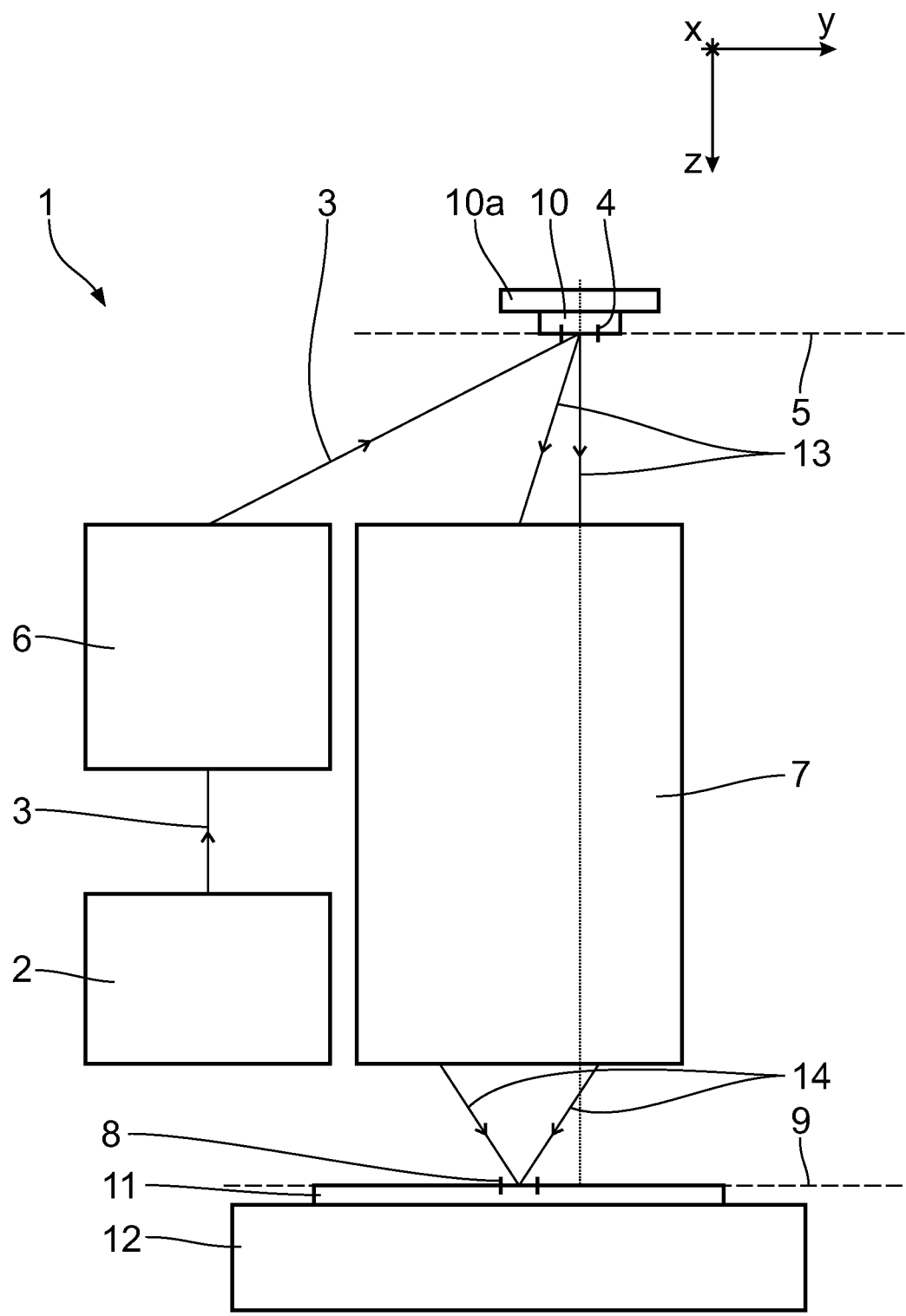

The imaging by the projection optical unit 7 is effected onto the surface of a substrate 11 in the form of a wafer that is carried by a substrate or wafer holder 12. FIG. 1 schematically illustrates, between the reticle 10 and the projection optical unit 7, a beam 13 of the illumination light 3 entering into the projection optical unit and, between the projection optical unit 7 and the substrate 11, a beam 14 of the illumination light 3 emerging from the projecting optical unit 7. An image-field-side numerical aperture (NA) of the projection optical unit 7 in the embodiment according to FIG. 2 is 0.45. This is not reproduced to scale in FIG. 1.

In order to facilitate the description of the projection exposure apparatus 1 and the various embodiments of the projection optical unit 7, a Cartesian xyz coordinate system is indicated in the drawing, the respective positional relationship of the components illustrated in the figures being evident from the system. In FIG. 1, the x-direction runs perpendicular to the plane of the drawing into the latter. The y-direction runs toward the right and the z-direction runs downward.

The projection exposure apparatus 1 is of the scanner type. Both the reticle 10 and the substrate 11 are scanned in the y-direction during the operation of the projection exposure apparatus 1. A stepper type of the projection exposure apparatus 1, in which a step-by-step displacement of the reticle 10 and of the substrate 11 in the y-direction takes place between individual exposures of the substrate 11, is also possible. The y-direction is also designated as the object displacement direction.

FIG. 2 shows the optical design of the projection optical unit 7. The illustration in FIG. 2 shows the beam path of in each case three individual rays 15 which proceed from three object field points spaced apart from one another in the y-direction in FIG. 2. The plane of the drawing in FIG. 2 represents a meridional section. The course of the chief ray 16 of the central object field point therefore lies in the plane of the drawing according to FIG. 2. A chief ray plane therefore lies parallel to the yz plane. The central chief ray is the chief ray 16 of a central point of the object field 4. This central point is defined as the point which lies in the center between the two marginal object field points in the meridional section. The three individual rays 15 associated with one of the three object field points are respectively assigned to three different illumination directions for the three object field points. A pupil plane 17 of the projection optical 7 according to FIG. 2 lies in the imaging beam path between the mirrors M1 and M2. A further pupil plane of the projection optical unit 7 according to FIG. 2 lies in the imaging beam path between the mirrors M5 and M6. The chief rays 16 running through the center of a pupil in the pupil plane 17 of the projection optical unit 7 are depicted only for illustrative reasons in FIG. 2, since, on account of a central pupil obscuration of the projection optical unit 7, which therefore constitutes a pupil-obscured system, virtual or obscured imaging beam paths of the projection optical unit 7 are involved, rather than real imaging beam paths. The chief rays 16, proceeding from the object plane 5, firstly run divergently. This is also designated hereinafter as a negative back focus of an entrance pupil of the projection optical unit 7. An entrance pupil of the projection optical unit 7 according to FIG. 2 does not lie within the projection optical unit 7, but rather in the beam path upstream of the object plane 5. This makes it possible, for example, in the beam path upstream of the projection optical unit 7, to arrange a pupil component of the illumination optical unit 6 in the entrance pupil of the projection optical unit 7, without further imaging optical components having to be present between the pupil component and the object plane 5.

The projection optical unit 7 according to FIG. 2 has a total of six mirrors, on which the individual rays 15 impinge with angles of incidence of less than 45° and which are also designated as NI mirrors. These NI mirrors are consecutively numbered with M1 to M6 in the order of the beam path of the individual rays 15 proceeding from the object field 4.

A mirror GI for grazing incidence of the imaging light 3 is arranged between the mirrors M4 and M5. The mirror GI for grazing incidence is therefore arranged in the imaging beam path of the projection optical unit 7 between two further optical components which guide the imaging light 3, namely between the mirrors M4 and M5. The individual rays 15 of the imaging light 3 impinge on the mirror GI with an angle of incidence that is greater than 70°. In the embodiment illustrated, the mirror GI is impinged on with a minimum angle of incidence of 77°. Depending on the embodiment of the projection optical unit 7, the mirror GI can reflect the individual rays 15 with angles of incidence which are greater than 70°, which are greater than 75° or which are greater than 80°.

The mirror GI is, to a first approximation, a folding mirror for the imaging beam path of the projection optical unit 7. Without the mirror GI, that is to say without the folding associated with the mirror GI, the projection optical unit 7 corresponds to the projection optical unit described in FIG. 3 of WO 2010/091800 A1.

FIG. 2 illustrates the calculated reflection surfaces of the mirrors M1 to M6 and GI. Only a partial region of the calculated reflection surfaces is used, as is evident in the illustration according to FIG. 2. Only this actually used region of the reflection surfaces is actually present in the real mirrors M1 to M6 and GI. These used reflection surfaces are carried by mirror bodies in a known manner.

As already mentioned, the projection optical unit 7 is a pupil-obscured system. The last mirror M6 in the beam path of the imaging light 3 upstream of the image field 8 has a through opening 17a for the imaging light 3. An intermediate image plane 18 of the projection optical unit 7 lies in the region of the through opening 17a.

The mirror GI for grazing incidence is arranged near the intermediate image plane 18, that is to say in a near-film manner, in the imaging beam path of the projection optical unit 7. A tangential or meridional intermediate image lies in the imaging beam path of the projection optical unit 7 in the region of the reflection of the imaging light 3 on the mirror GI. A sagittal intermediate image lies in the imaging beam path of the projection optical unit 7 between the mirror M4 and the mirror GI.

In this case, the mirror GI fulfils the parameter condition:
$P(GI) < 0.4$.

The following holds true for the pupil parameter P:
$P = D(SA)/(D(SA) + D(CR))$.

In this case, D(SA) is the maximum diameter of a sub aperture of an imaging beam, proceeding from an object field point, on a reflective surface of the respective mirror M. D(CR) is a maximum distance between chief rays emerging from the object field 4, wherein the distance D(CR) is measured in a reference plane of the projection optical unit 7 on the reflective surface of the mirror M. The maximum distance need not lie in the plane of the drawing in FIG. 2, but rather can in particular also be present in the x-direction perpendicular to the plane of the drawing in the object field 4. D(SA)=0 and thus P=0 holds true in the field planes of the projection optical unit 7. D(CR)=0 and thus P=1 holds true in the pupil planes of the projection optical unit 7.

The mirrors M2, M5 and M6 are arranged in a near-pupil manner, that is to say in proximity to pupil planes in the imaging beam path of the projection optical unit 7. In this case, the mirrors M2, M5 and M6 fulfill the parameter condition:
$P(M2, M5, M6) > 0.6$.

At least one of the mirrors M2, M5 or M6 is embodied as a compensation element having a pupil-dependent throughput profile for the imaging light 3.

All six NI mirrors M1 to M6 and the mirror GI for grazing incidence of the projection optical unit 7 are embodied as freeform surfaces which cannot be described by a rotationally symmetrical function. Other embodiments of the projection optical unit 7 are also possible in which at least one or else none of the mirrors M1 to M6, GI has such a freeform reflection surface.

Such a freeform surface can be produced from a rotationally symmetrical reference surface. Such freeform surfaces for reflection surfaces of the mirrors of projection optical units of projection exposure apparatuses for microlithography are known from US 2007-0058269 A1.

The freeform surfaces of the mirrors M1 to M6, GI are calculated on the basis of the following equation:

$$z = \frac{x^2/RDX + y^2/RDY}{1 + \sqrt{1 - (1 + CCX)(x/RDX)^2 - (1 + CCY)(y/RDX)^2}} + FFF$$

$$FFF = c1*x + c2*y + c3*x**2 + c4*x*y + c5*y**2 + c6*x**3 +$$
$$\ldots + c9*y**3 + c10*x**4 + \ldots + c12*x**2*y**2 +$$
$$\ldots + c14*y**4 + c15*x**5 + \ldots + c20*y**5 +$$
$$c21*x**6 + \ldots + c24*x**3*y**3 + \ldots + c27*y**6 \ldots$$

In this case, x and y denote the coordinates on the surface, proceeding from a reference axis. z denotes a sagittal height of the respective freeform surface. RDX and RDY, and CCX and CCY are the radii and conical constants of the basic asphere. FFF describes the freeform fraction applied to the basic asphere.

The surfaces have decentrations which satisfy the following rules:
DEC: Axial decentration
DAR: Individual decentration of a surface
GLO: Global reference to the image plane.

The translations are input via the parameters XDE, YDE, ZDE and the rotation angles are input via the parameters ADE, BDE, CDE. The meaning of these parameters corresponds to that known from the optical design program CODE V®. This meaning will be briefly explained again below. With regard to the decentrations, it should be taken into consideration that, in contrast to the description known from CODE V®, an additional rotation by 180° about the y-axis is also performed. This leads to positive distance values between the mirrors or between the reference surfaces.

For the types DEC and GLO, translations XDH, YDH, ZDH and rotation angles ADH, BDH, CDH behind the surface are additionally specified as well.

ADE Rotation of the surface with angle alpha in degrees about the x-axis.
BDE Rotation of the surface with angle beta in degrees about the y'-axis.
CDE Rotation of the surface with angle gamma in degrees about the z" axis.
XDE Translation of the surface in the x-axis in mm.
YDE Translation of the surface in the y-axis in mm.
ZDE Translation of the surface in the z-axis in mm.
ADH Rotation of the coordinate system after the surface with angle alpha in degrees about the x" axis.
BDH Rotation of the coordinate system after the surface with angle beta in degrees about the y'-axis.
CDH Rotation of the coordinate system after the surface with angle gamma in degrees about the z-axis.
XDH Translation of the coordinate system after the surface in the x-axis in mm.
YDH Translation of the coordinate system after the surface in the y-axis in mm.
ZDH Translation of the coordinate system after the surface in the z-axis in mm.

The axes of the coordinate systems x', y', z' and x", y", z" are the axes that respectively emerge from the preceding rotation and displacement operations.

The optical design data of the reflection surfaces of the mirrors M1 to M6 and GI of the projection optical unit 7 can be gathered from the following tables. These optical design data proceed in each case from the image plane 9, that is to say describe the projection optical unit 7 in an opposite application direction of the imaging light 3 between the image plane 9 and the object plane 5.

Surface Data:

| No. | Radius | Thickness |
| --- | --- | --- |
| Image plane (IP) | 0.000000000000 | 635.592185834912 |
| M6 | −697.324542049600 | 571.520181703339 |
| M5 | 353.230203853982 | 571.520181703339 |
| HF | 0 | 217.718562271856 |
| GI | −1334.429781753643 | 1111.664014624771 |
| M4 | −4625.506567737336 | 1012.187814371928 |
| M3 | −2078.164541511372 | 921.918909401685 |
| M2 | 431.564016638290 | 1075.234696944930 |
| M1 | −1475.325607892267 | 1364.283032398024 |
| Object plane (OP) | 0 | 0 |

In this case, HF denotes an auxiliary reference surface representing the position of the through opening 17a in the mirror M6.

Decentrations:

| | | | | | |
| --- | --- | --- | --- | --- | --- |
| DEZ M6 | DAR | | | | |
| XDE M6 | 0.00000 | YDE M6 | −22.80126 | ZDE M6 | 2.26178 |
| ADE M6 | 7.16687 | BDE M6 | 0.00000 | CDE M6 | 0.00000 |
| DEZ M5 | DAR | | | | |
| XDE M5 | 0.00000 | YDE M5 | 105.51244 | ZDE M5 | −8.61661 |
| ADE M5 | −11.32612 | BDE M5 | 0.00000 | CDE M5 | 0.00000 |
| DEZ HF | DAR | | | | |
| XDE HF | 0.00000 | YDE HF | −10.16945 | ZDE HF | 0.00000 |
| ADE HF | 7.16687 | BDE HF | 0.00000 | CDE HF | 0.00000 |
| DEZ GI | DEC | | | | |
| XDE GI | 0.00000 | YDE GI | −77.44727 | ZDE GI | 0.00000 |
| ADE GI | 93.19329 | BDE GI | 0.00000 | CDE GI | 0.00000 |
| ADH GI | 86.80670 | BDH GI | 0.00000 | CDH GI | 0.00000 |
| DEZ M4 | DEC | | | | |
| XDE M4 | 0.00000 | YDE M4 | −97.19109 | ZDE M4 | 0.00000 |
| ADE M4 | −2.19306 | BDE M4 | 0.00000 | CDE M4 | 0.00000 |
| ADH M4 | −2.19306 | BDH M4 | 0.00000 | CDH M4 | 0.00000 |
| DEZ M3 | DEC | | | | |
| XDE M3 | 0.00000 | YDE M3 | −102.24326 | ZDE M3 | 0.00000 |
| ADE M3 | −3.91365 | BDE M3 | 0.00000 | CDE M3 | 0.00000 |
| ADH M3 | −3.91365 | BDH M3 | 0.00000 | CDH M3 | 0.00000 |
| DEZ M2 | DEC | | | | |
| XDE M2 | 0.00000 | YDE M2 | −93.10606 | ZDE M2 | 0.00000 |
| ADE M2 | −8.46145 | BDE M2 | 0.00000 | CDE M2 | 0.00000 |
| ADH M2 | −8.46145 | BDH M2 | 0.00000 | CDH M2 | 0.00000 |
| DEZ M1 | DEC | | | | |
| XDE M1 | 0.00000 | YDE M1 | −108.70428 | ZDE M1 | 0.00000 |
| ADE M1 | −8.13349 | BDE M1 | 0.00000 | CDE M1 | 0.00000 |
| ADH M1 | −8.13349 | BDH M1 | 0.00000 | CDH M1 | 0.00000 |
| DEZ OE | GLO | BE | | | |
| XDE OE | 0.00000 | YDE OE | 905.68748 | ZDE OE | 2199.93035 |

Asphere Data:
Surface: M6
Constants:

| | |
| --- | --- |
| RDX = −917.332775 | CCX = 0.179583210 |
| RDY = −697.324542 | CCY = 0.168431398 |

Expansion Constants:

| | | |
| --- | --- | --- |
| $c1 = 0.00000000E+00$ | $c2 = 0.00000000E+00$ | $c3 = -4.02473677E-05$ |
| $c4 = 0.00000000E+00$ | $c5 = -6.09879197E-06$ | $c6 = 0.00000000E+00$ |
| $c7 = 6.04072748E-09$ | $c8 = 0.00000000E+00$ | $c9 = -1.04586750E-08$ |
| $c10 = -4.77578782E-11$ | $c11 = 0.00000000E+00$ | $c12 = -3.98011969E-11$ |
| $c13 = 0.00000000E+00$ | $c14 = 2.45428959E-11$ | $c15 = 0.00000000E+00$ |
| $c16 = 1.47721389E-15$ | $c17 = 0.00000000E+00$ | $c18 = 1.39564413E-14$ |
| $c19 = 0.00000000E+00$ | $c20 = -2.15641508E-14$ | $c21 = -6.71591163E-17$ |
| $c22 = 0.00000000E+00$ | $c23 = -1.88232796E-16$ | $c24 = 0.00000000E+00$ |

-continued

| | | |
|---|---|---|
| c25 = −5.41994570E−17 | c26 = 0.00000000E+00 | c27 = 5.63677811E−17 |
| c28 = 0.00000000E+00 | c29 = 1.41168978E−20 | c30 = 0.00000000E+00 |
| c31 = 4.45415210E−21 | c32 = 0.00000000E+00 | c33 = 1.01046574E−20 |
| c34 = 0.00000000E+00 | c35 = −2.77920084E−20 | c36 = −1.11232196E−22 |
| c37 = 0.00000000E+00 | c38 = −4.46332085E−22 | c39 = 0.00000000E+00 |
| c40 = −5.09205105E−22 | c41 = 0.00000000E+00 | c42 = −4.50757930E−23 |
| c43 = 0.00000000E+00 | c44 = 1.31010481E−22 | c45 = 0.00000000E+00 |
| c46 = 3.97840221E−26 | c47 = 0.00000000E+00 | c48 = 4.80957498E−26 |
| c49 = 0.00000000E+00 | c50 = −1.09593883E−26 | c51 = 0.00000000E+00 |
| c52 = −9.64563074E−26 | c53 = 0.00000000E+00 | c54 = −7.38111927E−26 |
| c55 = −6.36923759E−29 | c56 = 0.00000000E+00 | c57 = −6.20104807E−28 |
| c58 = 0.00000000E+00 | c59 = −1.28891117E−27 | c60 = 0.00000000E+00 |
| c61 = −8.14395528E−28 | c62 = 0.00000000E+00 | c63 = 1.40754785E−28 |
| c64 = 0.00000000E+00 | c65 = 2.16012977E−28 | c66 = 0.00000000E+00 |
| c67 = −3.43709137E−32 | c68 = 0.00000000E+00 | c69 = 1.45762003E−31 |
| c70 = 0.00000000E+00 | c71 = 1.47006833E−31 | c72 = 0.00000000E+00 |
| c73 = −3.75554498E−31 | c74 = 0.00000000E+00 | c75 = −6.33156588E−31 |
| c76 = 0.00000000E+00 | c77 = −2.79666410E−31 | c78 = −6.35008308E−34 |
| c79 = 0.00000000E+00 | c80 = −3.15709777E−33 | c81 = 0.00000000E+00 |
| c82 = −7.73163615E−33 | c83 = 0.00000000E+00 | c84 = −1.00398379E−32 |
| c85 = 0.00000000E+00 | c86 = −5.57346733E−33 | c87 = 0.00000000E+00 |
| c88 = 2.56628299E−34 | c89 = 0.00000000E+00 | c90 = 9.88843170E−34 |

Surface: M5

| | |
|---|---|
| RDX = 3915.137333 | CCX = 0.000000000 |
| RDY = 353.230204 | CCY = 0.000000000 |

Expansion Constants:

| | | |
|---|---|---|
| c1 = 0.00000000E+00 | c2 = 0.00000000E+00 | c3 = 5.29920535E−05 |
| c4 = 0.00000000E+00 | c5 = −2.93078961E−04 | c6 = 0.00000000E+00 |
| c7 = −4.93884752E−08 | c8 = 0.00000000E+00 | c9 = 7.87285048E−07 |
| c10 = 4.45614854E−10 | c11 = 0.00000000E+00 | c12 = 3.16806753E−09 |
| c13 = 0.00000000E+00 | c14 = 4.81357208E−09 | c15 = 0.00000000E+00 |
| c16 = 9.41429364E−13 | c17 = 0.00000000E+00 | c18 = 6.21216113E−13 |
| c19 = 0.00000000E+00 | c20 = 1.37582681E−11 | c21 = 1.27107652E−15 |
| c22 = 0.00000000E+00 | c23 = 8.59481684E−15 | c24 = 0.00000000E+00 |
| c25 = 3.61553153E−14 | c26 = 0.00000000E+00 | c27 = 1.78109958E−15 |
| c28 = 0.00000000E+00 | c29 = 1.37830695E−18 | c30 = 0.00000000E+00 |
| c31 = 9.30564894E−18 | c32 = 0.00000000E+00 | c33 = −2.26973380E−16 |
| c34 = 0.00000000E+00 | c35 = −3.57185085E−16 | c36 = 3.06857815E−21 |
| c37 = 0.00000000E+00 | c38 = 2.60556554E−20 | c39 = 0.00000000E+00 |
| c40 = 6.56101074E−21 | c41 = 0.00000000E+00 | c42 = 6.21555699E−19 |
| c43 = 0.00000000E+00 | c44 = 2.46292188E−18 | c45 = 0.00000000E+0 |
| c46 = 2.56489872E−23 | c47 = 0.00000000E+00 | c48 = −1.12842117E−22 |
| c49 = 0.00000000E+00 | c50 = 1.49690753E−22 | c51 = 0.00000000E+00 |
| c52 = 1.10932162E−20 | c53 = 0.00000000E+00 | c54 = 2.88400249E−20 |
| c55 = 7.63178495E−26 | c56 = 0.00000000E+00 | c57 = 4.36427023E−25 |
| c58 = 0.00000000E+00 | c59 = 8.15412615E−25 | c60 = 0.00000000E+00 |
| c61 = 8.37878581E−24 | c62 = 0.00000000E+00 | c63 = 5.71155554E−23 |
| c64 = 0.00000000E+00 | c65 = 8.50307305E−23 | |

Surface: GI
Constants

| | |
|---|---|
| RDX = −644.171559 | CCX = 0.000000000 |
| RDY = −1334.429782 | CCY = 0.000000000 |

Expansion Constants:

| | | |
|---|---|---|
| c1 = 0.00000000E+00 | c2 = 0.00000000E+00 | c3 = 8.07672990E−04 |
| c4 = 0.00000000E+00 | c5 = 3.72700079E−04 | c6 = 0.00000000E+00 |
| c7 = −4.63644654E−08 | c8 = 0.00000000E+00 | c9 = 3.67344477E−09 |
| c10 = 4.68885092E−10 | c11 = 0.00000000E+00 | c12 = 4.01268956E−10 |
| c13 = 0.00000000E+00 | c14 = 4.46985613E−11 | c15 = 0.00000000E+00 |
| c16 = −3.49421282E−14 | c17 = 0.00000000E+00 | c18 = −5.77192291E−14 |
| c19 = 0.00000000E+00 | c20 = 9.36083562E−15 | c21 = −1.42382435E−16 |
| c22 = 0.00000000E+00 | c23 = 1.05187032E−15 | c24 = 0.00000000E+00 |
| c25 = 8.72635125E−17 | c26 = 0.00000000E+00 | c27 = 6.52399426E−17 |
| c28 = 0.00000000E+00 | c29 = 4.89972278E−18 | c30 = 0.00000000E+00 |
| c31 = −2.70005564E−18 | c32 = 0.00000000E+00 | c33 = 9.04462881E−19 |
| c34 = 0.00000000E+00 | c35 = −5.17662264E−19 | c36 = 5.96341023E−20 |
| c37 = 0.00000000E+00 | c38 = −7.92638082E−21 | c39 = 0.00000000E+00 |
| c40 = 1.08196566E−20 | c41 = 0.00000000E+00 | c42 = −3.84269412E−21 |
| c43 = 0.00000000E+00 | c44 = 2.24997535E−21 | c45 = 0.00000000E+00 |
| c46 = −1.22265103E−22 | c47 = 0.00000000E+00 | c48 = 6.45794429E−23 |
| c49 = 0.00000000E+00 | c50 = −1.08005807E−23 | c51 = 0.00000000E+00 |
| c52 = 8.13883017E−24 | c53 = 0.00000000E+00 | c54 = −4.94043024E−24 |
| c55 = −2.11326698E−24 | c56 = 0.00000000E+00 | c57 = −6.17811094E−26 |
| c58 = 0.00000000E+00 | c59 = −2.33699745E−25 | c60 = 0.00000000E+00 |
| c61 = 5.24220267E−28 | c62 = 0.00000000E+00 | c63 = −5.94133137E−27 |
| c64 = 0.00000000E+00 | c65 = 4.43307544E−27 | |

Surface: M4
Constants:

| RDX = −4082.646385 | CCX = 0.000000000 |
|---|---|
| RDY = −4625.506568 | CCY = 0.000000000 |

Expansion Constants:

| $c1 = 0.00000000E+00$ | $c2 = 0.00000000E+00$ | $c3 = 1.85251433E-05$ |
|---|---|---|
| $c4 = 0.00000000E+00$ | $c5 = 2.25195346E-05$ | $c6 = 0.00000000E+00$ |
| $c7 = 5.47050183E-08$ | $c8 = 0.00000000E+00$ | $c9 = 5.60435081E-08$ |
| $c10 = 5.32099048E-11$ | $c11 = 0.00000000E+00$ | $c12 = 1.00618622E-10$ |
| $c13 = 0.00000000E+00$ | $c14 = 8.15546185E-11$ | $c15 = 0.00000000E+00$ |
| $c16 = 2.65401594E-14$ | $c17 = 0.00000000E+00$ | $c18 = -4.16264147E-15$ |
| $c19 = 0.00000000E+00$ | $c20 = 9.76262100E-14$ | $c21 = 5.34858263E-17$ |
| $c22 = 0.00000000E+00$ | $c23 = 5.52714903E-17$ | $c24 = 0.00000000E+00$ |
| $c25 = -1.33753059E-16$ | $c26 = 0.00000000E+00$ | $c27 = 6.73451977E-16$ |
| $c28 = 0.00000000E+00$ | $c29 = 5.17817385E-20$ | $c30 = 0.00000000E+00$ |
| $c31 = -3.86385897E-20$ | $c32 = 0.00000000E+00$ | $c33 = -6.37810309E-19$ |
| $c34 = 0.00000000E+00$ | $c35 = 3.23251521E-18$ | $c36 = -1.33220128E-21$ |
| $c37 = 0.00000000E+00$ | $c38 = -1.86463397E-21$ | $c39 = 0.00000000E+00$ |
| $c40 = -4.03043950E-22$ | $c41 = 0.00000000E+00$ | $c42 = -1.83446745E-21$ |
| $c43 = 0.00000000E+00$ | $c44 = 4.16198967E-21$ | $c45 = 0.00000000E+00$ |
| $c46 = -2.16664402E-23$ | $c47 = 0.00000000E+00$ | $c48 = -2.23909426E-23$ |
| $c49 = 0.00000000E+00$ | $c50 = -6.94055066E-24$ | $c51 = 0.00000000E+00$ |
| $c52 = -8.28261199E-24$ | $c53 = 0.00000000E+00$ | $c54 = -3.35070919E-24$ |
| $c55 = -8.25226331E-27$ | $c56 = 0.00000000E+00$ | $c57 = -8.61854917E-26$ |
| $c58 = 0.00000000E+00$ | $c59 = 5.60291069E-26$ | $c60 = 0.00000000E+00$ |
| $c61 = -2.27579602E-26$ | $c62 = 0.00000000E+00$ | $c63 = -1.69481816E-26$ |
| $c64 = 0.00000000E+00$ | $c65 = -8.29941948E-27$ | |

Surface: M3
Constants:

| RDX = −1887.288302 | CCX = 0.000000000 |
|---|---|
| RDY = −2078.164542 | CCY = 0.000000000 |

Expansion Constants:

| $c1 = 0.00000000E+00$ | $c2 = 0.00000000E+00$ | $c3 = -2.92033297E-05$ |
|---|---|---|
| $c4 = 0.00000000E+00$ | $c5 = -3.54484027E-05$ | $c6 = 0.00000000E+00$ |
| $c7 = -1.25542622E-08$ | $c8 = 0.00000000E+00$ | $c9 = -1.41035320E-08$ |
| $c10 = -1.32924391E-11$ | $c11 = 0.00000000E+00$ | $c12 = -1.64612949E-11$ |
| $c13 = 0.00000000E+00$ | $c14 = -1.68068310E-11$ | $c15 = 0.00000000E+00$ |
| $c16 = 2.30073021E-15$ | $c17 = 0.00000000E+00$ | $c18 = 1.81436248E-14$ |
| $c19 = 0.00000000E+00$ | $c20 = -1.27693774E-15$ | $c21 = -8.48090968E-18$ |
| $c22 = 0.00000000E+00$ | $c23 = -1.27548438E-17$ | $c24 = 0.00000000E+00$ |
| $c25 = 9.25543551E-19$ | $c26 = 0.00000000E+00$ | $c27 = -9.90176393E-17$ |
| $c28 = 0.00000000E+00$ | $c29 = 2.28137205E-20$ | $c30 = 0.00000000E+00$ |
| $c31 = 3.64318681E-20$ | $c32 = 0.00000000E+00$ | $c33 = 1.09005054E-19$ |
| $c34 = 0.00000000E+00$ | $c35 = -2.27111064E-19$ | $c36 = 4.94712966E-24$ |
| $c37 = 0.00000000E+00$ | $c38 = 5.02807168E-23$ | $c39 = 0.00000000E+00$ |
| $c40 = -1.03115229E-23$ | $c41 = 0.00000000E+00$ | $c42 = 8.31801106E-23$ |
| $c43 = 0.00000000E+00$ | $c44 = 4.58532779E-22$ | $c45 = 0.00000000E+00$ |
| $c46 = 6.06916220E-26$ | $c47 = 0.00000000E+00$ | $c48 = 2.62857201E-25$ |
| $c49 = 0.00000000E+00$ | $c50 = 1.65899510E-25$ | $c51 = 0.00000000E+00$ |
| $c52 = -5.48370499E-25$ | $c53 = 0.00000000E+00$ | $c54 = 9.83834584E-25$ |
| $c55 = 9.95978887E-29$ | $c56 = 0.00000000E+00$ | $c57 = -1.48457495E-28$ |
| $c58 = 0.00000000E+00$ | $c59 = 4.15183863E-28$ | $c60 = 0.00000000E+00$ |
| $c61 = 7.01954472E-28$ | $c62 = 0.00000000E+00$ | $c63 = -9.24941655E-28$ |
| $c64 = 0.00000000E+00$ | $c65 = 7.94667554E-29$ | |

Surface: M2
Constants:

| RDX = 1276.899447 | CCX = 0.000000000 |
|---|---|
| RDY = 431.564017 | CCY = 0.000000000 |

Expansion Constants:

| $c1 = 0.00000000E+00$ | $c2 = 0.00000000E+00$ | $c3 = 1.11313380E-04$ |
|---|---|---|
| $c4 = 0.00000000E+00$ | $c5 = 2.14647773E-04$ | $c6 = 0.00000000E+00$ |
| $c7 = -3.03467553E-06$ | $c8 = 0.00000000E+00$ | $c9 = -1.70130264E-06$ |
| $c10 = 3.26179145E-09$ | $c11 = 0.00000000E+00$ | $c12 = -9.02665432E-09$ |
| $c13 = 0.00000000E+00$ | $c14 = 5.71663297E-09$ | $c15 = 0.00000000E+00$ |
| $c16 = -3.47934319E-11$ | $c17 = 0.00000000E+00$ | $c18 = -8.34418700E-12$ |
| $c19 = 0.00000000E+00$ | $c20 = -5.59174256E-11$ | $c21 = -1.75860911E-14$ |
| $c22 = 0.00000000E+00$ | $c23 = 2.82181782E-13$ | $c24 = 0.00000000E+00$ |
| $c25 = -2.44935539E-13$ | $c26 = 0.00000000E+00$ | $c27 = 5.73915888E-13$ |
| $c28 = 0.00000000E+00$ | $c29 = -2.58379099E-16$ | $c30 = 0.00000000E+00$ |
| $c31 = -7.23238163E-16$ | $c32 = 0.00000000E+00$ | $c33 = -4.43545777E-16$ |
| $c34 = 0.00000000E+00$ | $c35 = 3.81426897E-15$ | $c36 = 1.28360226E-19$ |
| $c37 = 0.00000000E+00$ | $c38 = 8.75713044E-18$ | $c39 = 0.00000000E+00$ |
| $c40 = 1.83541997E-17$ | $c41 = 0.00000000E+00$ | $c42 = -2.72798014E-17$ |
| $c43 = 0.00000000E+00$ | $c44 = -5.92604691E-17$ | $c45 = 0.00000000E+00$ |
| $c46 = 3.71301848E-20$ | $c47 = 0.00000000E+00$ | $c48 = -5.19525052E-21$ |
| $c49 = 0.00000000E+00$ | $c50 = -8.78422864E-20$ | $c51 = 0.00000000E+00$ |

-continued

| | | |
|---|---|---|
| $c52 = -3.35110906E-19$ | $c53 = 0.00000000E+00$ | $c54 = -1.95141962E-19$ |
| $c55 = -3.00156653E-22$ | $c56 = 0.00000000E+00$ | $c57 = -5.57643556E-22$ |
| $c58 = 0.00000000E+00$ | $c59 = 4.42175766E-23$ | $c60 = 0.00000000E+00$ |
| $c61 = 9.58753094E-22$ | $c62 = 0.00000000E+00$ | $c63 = 1.21980710E-21$ |
| $c64 = 0.00000000E+00$ | $c65 = 1.86834029E-21$ | |

Surface: M1
Constants:

| | |
|---|---|
| RDX = −1579.063390 | CCX = 0.000000000 |
| RDY = −1475.325608 | CCY = 0.000000000 |

Expansion Constants:

| | | |
|---|---|---|
| $c1 = 0.00000000E+00$ | $c2 = 0.00000000E+00$ | $c3 = 0.00000000E+00$ |
| $c4 = 0.00000000E+00$ | $c5 = 0.00000000E+00$ | $c6 = 0.00000000E+00$ |
| $c7 = -2.68327321E-08$ | $c8 = 0.00000000E+00$ | $c9 = -1.91801651E-08$ |
| $c10 = -3.66552981E-12$ | $c11 = 0.00000000E+00$ | $c12 = -3.82777603E-13$ |
| $c13 = 0.00000000E+00$ | $c14 = 8.62803943E-12$ | $c15 = 0.00000000E+00$ |
| $c16 = -1.34436497E-14$ | $c17 = 0.00000000E+00$ | $c18 = -2.62422138E-14$ |
| $c19 = 0.00000000E+00$ | $c20 = -7.74167732E-15$ | $c21 = -1.40385167E-18$ |
| $c22 = 0.00000000E+00$ | $c23 = -6.99085149E-18$ | $c24 = 0.00000000E+00$ |
| $c25 = 1.58855230E-17$ | $c26 = 0.00000000E+00$ | $c27 = 9.83820627E-17$ |
| $c28 = 0.00000000E+00$ | $c29 = -8.15873695E-21$ | $c30 = 0.00000000E+00$ |
| $c31 = -1.53254148E-20$ | $c32 = 0.00000000E+00$ | $c33 = -2.46991965E-20$ |
| $c34 = 0.00000000E+00$ | $c35 = 5.56202200E-20$ | $c36 = -7.62334687E-24$ |
| $c37 = 0.00000000E+00$ | $c38 = -6.22654015E-24$ | $c39 = 0.00000000E+00$ |
| $c40 = -6.66341030E-23$ | $c41 = 0.00000000E+00$ | $c42 = -6.94753708E-23$ |
| $c43 = 0.00000000E+00$ | $c44 = -5.48149098E-22$ | $c45 = 0.00000000E+00$ |
| $c46 = 1.23529899E-26$ | $c47 = 0.00000000E+00$ | $c48 = -2.82595551E-26$ |
| $c49 = 0.00000000E+00$ | $c50 = -1.08751675E-25$ | $c51 = 0.00000000E+00$ |
| $c52 = 2.80187735E-25$ | $c53 = 0.00000000E+00$ | $c54 = 2.56650230E-25$ |
| $c55 = 4.36596748E-29$ | $c56 = 0.00000000E+00$ | $c57 = -1.09458826E-28$ |
| $c58 = 0.00000000E+00$ | $c59 = 2.99374019E-28$ | $c60 = 0.00000000E+00$ |
| $c61 = 1.34192743E-27$ | $c62 = 0.00000000E+00$ | $c63 = 1.21228052E-27$ |
| $c64 = 0.00000000E+00$ | $c65 = 1.69942336E-27$ | |

Figure 3:
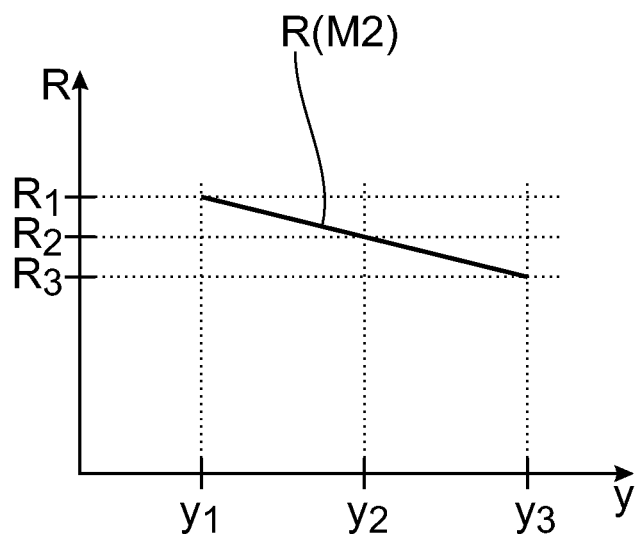
FIG. 3 shows the dependence of a reflectivity of a selected mirror of the projection optical unit on a coordinate parallel to an object displacement direction (y)

FIG. 3 schematically shows the reflectivity R (M2) of the mirror M2 as a function of the y-coordinate. For a smallest y-value $y_1$, the reflectivity R (M2) is the highest and is $R_1$. Approximately in the center of the mirror M2, at the coordinate $y_2$, the reflectivity R (M2)=$R_2$, where $R_2<R_1$. In the region of the highest y-values, that is to say at $y_3$, the reflectivity R (M2)=$R_3$, where $R_3<R_2$ holds true. This reflectivity profile at the mirror M2 compensates for differences in reflectivity for the individual rays 15 of the imaging light 3 at the mirror GI for grazing incidence. Alternatively or additionally, the mirrors M5 or M6 can bear coatings having corresponding reflectivity profiles. The reflectivity profile R (M2) according to FIG. 3 can be achieved via a corresponding layer thickness profile of the reflection coating on the mirror M2.

The near-pupil mirrors M5 or M6 are also suitable for the use of a corresponding R(y) reflectivity profile for compensation purposes.

As an alternative to a coating having a reflectivity profile corresponding to that illustrated schematically in FIG. 3, at least one of the mirrors M2, M5 or M6 can be embodied, via other measures, as compensation element having a pupil-dependent throughput profile for the imaging light 3. By way of example, a surface of the mirrors M2, M5 and M6 can be provided with a roughness variation. Alternatively, a neutral filter having a transmission profile whose effect corresponds to the reflectivity profile according to FIG. 3 can be arranged as compensation element having a pupil-dependent throughput profile for the imaging light 3 also in the region of one of the pupil planes of the projection optical unit 7. At least one of the mirrors M2, M5 or M6 can also bear a corresponding neutral filter coating.

In principle, any of the NI mirrors is appropriate for one of the variants of a coating as explained above, in particular the mirrors M1, M2, M3, M5 and M6.

The mirrors M1 to M6 bear multiple reflection layers for optimizing their reflection for the impinging EUV illumination light 3. The multiple reflection layers are designed for an operating wavelength of 13.5 nm. The reflection can be optimized all the better, the nearer the impingement angle of the individual rays 15 on the mirror surface is to normal incidence. The projection optical unit 7 has small reflection angles overall for all the individual rays 15 on the NI mirrors M1 to M6. A maximum angle of incidence of the imaging light 3 on the NI mirrors M1 to M6 is at most 25°. At the mirror M1 the maximum angle of incidence of the individual rays 15 is 13°. At the mirror M2 the maximum angle of incidence of the individual rays 15 is 16°. At the mirror M3 the maximum angle of incidence of the individual rays 15 is 13°. At the mirror M4 the maximum angle of incidence of the individual rays 15 is 8°. At the mirror M5 the maximum angle of incidence of the individual rays 15 is 15°. At the mirror M6 the maximum angle of incidence of the individual rays 15 is 8°.

On the mirror M3, a reflection coating having a larger number of individual layers can be designed such that this coating is very critical to the angle of incidence. Since the individual rays 15 impinge on the mirror M3 with a bandwidth of angles of incidence, it is possible by this approach, too, to bring about a compensation of the reflectivity—dependent on the angle of incidence—of the mirror GI for grazing incidence. In this case, the multilayer reflection coating on the mirror M3 can be embodied such that it has a higher reflectivity at the location $M3_1$ that at a location $M3_2$, at which in turn a higher reflectivity than at the location $M3_3$ is then present (cf. FIG. 2).

Figure 4:
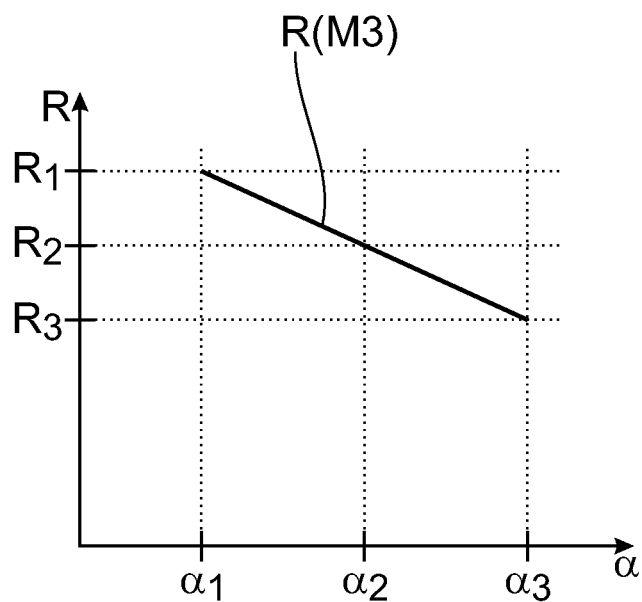
FIG. 4 shows a diagram of the dependence of a reflectivity of a multilayer reflection coating on one of the mirrors of the projection optical unit on the angle of incidence of the imaging light.

This dependence R (M3) of the reflectivity R on the angle α of incidence on the mirror M3 is illustrated in FIG. 4. In the region of the smallest angles of incidence, that is to say at $α=α_1$, the reflectivity is the highest and is $R_1$ there. These smallest angles $α_1$ of incidence are present in the mirror region $M3_1$. A medium reflectivity $R_2<R_1$ is present in the region of medium angles $α_2$ of incidence. These medium angles $α_2$ of incidence are present in the mirror region $M3_2$. The lowest reflectivity $R_3$ is present in the region of the largest angles $α_3$ of incidence. These largest angles $α_3$ of incidence are present in the mirror region $M3_3$.

In an alternative embodiment, the mirror GI for grazing incidence is arranged in the region of a pupil plane of the projection optical unit 7. Any variation possibly caused by this in an intensity of the imaging light over the image field 8 can be compensated for by precompensation of a distribution of the illumination intensity.

In principle, any of the NI mirrors M1 to M6 can be embodied as compensation mirror or compensation element in accordance with one of the above variants.

In a further variant of the projection optical unit, which can be used instead of the projection optical unit 7, a plurality of mirrors GI for grazing incidence are used.

For producing a micro- or nanostructured component, the projection exposure apparatus 1 is used as follows: firstly, the reflection mask 10 or the reticle and the substrate or the wafer 11 are provided. A structure on the reticle 10 is subsequently projected onto a light-sensitive layer of the wafer 11 with the aid of the projection exposure apparatus. Via the development of the light-sensitive layer, a micro- or nanostructure is then produced on the wafer 11 and the microstructured component is thus produced.

The invention claimed is:

1. An imaging optical unit, comprising:
a plurality of components configured to guide light along a path through the imaging optical unit from an object field in an object plane of the imaging optical unit to an image field in an image plane of the imaging optical unit, the plurality of components comprising a grazing incidence mirror, wherein the grazing incidence minor is in the path between two other components of the plurality of components, and wherein the imaging optical unit is a pupil-obscured imaging optical unit.

2. The imaging optical unit of claim 1, wherein the grazing incidence mirror is arranged in the path in a near-field manner.

3. The imaging optical unit of claim 1, further comprising a compensation element having a pupil-dependent throughput profile for the light.

4. The imaging optical unit of claim 1, wherein the grazing incidence mirror comprises a freeform reflection surface.

5. The imaging optical unit of claim 1, wherein the imaging optical unit is catoptric optical unit.

6. The imaging optical unit of claim 1, wherein, for each of the plurality of components which is not a grazing incidence mirror, a maximum angle of incidence of the light on the component is at most 25°.

7. The imaging optical unit of claim 1, wherein:
a component of the plurality of components other than the grazing incidence mirror is a compensation mirror;
first and second portions of the light are reflected by the grazing incidence mirror and the compensation mirror;
a reflectivity of the grazing mirror for the first portion of the light is lower than a reflectivity of the grazing incidence mirror for the second portion of the light; and
a reflectivity of the compensation mirror for the first portion of the light is higher than a reflectivity of the compensation mirror for the second portion of the light.

8. The imaging optical unit of claim 7, wherein the compensation mirror comprises a multilayer reflectivity coating having a layer thickness distribution which varies over a reflection surface of the compensation mirror.

9. An apparatus, comprising
an imaging optical unit according to claim 1; and
an illumination optical unit configured to guide the light to the object field of the imaging optical unit,
wherein the apparatus is a lithography projection exposure apparatus.

10. A method, comprising:
using a lithography projection exposure apparatus to project a structure on a reticle onto a light-sensitive layer,
wherein the lithography projection exposure apparatus comprises:
an imaging optical unit according to claim 1; and
an illumination optical unit configured to guide the light to the object field of the imaging optical unit.

11. An imaging optical unit, comprising:
a plurality of mirrors configured to guide light along a path through the imaging optical unit from an object field in an object plane of the imaging optical unit to an image field in an image plane of the imaging optical unit, the plurality of mirrors comprising a grazing incidence mirror, wherein the grazing incidence minor is in the path between two other mirrors of the plurality of optical mirrors, and wherein the imaging optical unit is a pupil-obscured imaging optical unit.

12. The imaging optical unit of claim 11, wherein the grazing incidence mirror is arranged in the path in a near-field manner.

13. The imaging optical unit of claim 11, further comprising a compensation element having a pupil-dependent throughput profile for the light.

14. The imaging optical unit of claim 11, wherein the grazing incidence mirror comprises a freeform reflection surface.

15. The imaging optical unit of claim 11, wherein the imaging optical unit is catoptric optical unit.

16. The imaging optical unit of claim 11, wherein, for each of the plurality of mirrors which is not a grazing incidence mirror, a maximum angle of incidence of the light on the mirror is at most 25°.

17. The imaging optical unit of claim 11, wherein:
an mirror of the plurality of mirrors other than the grazing incidence mirror is a compensation mirror;
first and second portions of the light are reflected by the grazing incidence mirror and the compensation mirror;
a reflectivity of the grazing mirror for the first portion of the light is lower than a reflectivity of the grazing incidence mirror for the second portion of the light; and
a reflectivity of the compensation mirror for the first portion of the light is higher than a reflectivity of the compensation mirror for the second portion of the light.

18. The imaging optical unit of claim 17, wherein the compensation mirror comprises a multilayer reflectivity coating having a layer thickness distribution which varies over a reflection surface of the compensation mirror.

19. An apparatus, comprising
an imaging optical unit according to claim 11; and
an illumination optical unit configured to guide the light to the object field of the imaging optical unit,
wherein the apparatus is a lithography projection exposure apparatus.

20. A method, comprising:
using a lithography projection exposure apparatus to project a structure on a reticle onto a light-sensitive layer,
wherein the lithography projection exposure apparatus comprises:
an imaging optical unit according to claim 11; and
an illumination optical unit configured to guide the light to the object field of the imaging optical unit.

* * * * *

UNITED STATES PATENT AND TRADEMARK OFFICE
CERTIFICATE OF CORRECTION

PATENT NO. : 9,291,751 B2
APPLICATION NO. : 13/919500
DATED : March 22, 2016
INVENTOR(S) : Rostalski et al.

It is certified that error appears in the above-identified patent and that said Letters Patent is hereby corrected as shown below:

In the claims

Col. 15, line 29, Claim 1, delete "minor" and insert -- mirror --.

Col. 16, line 16, Claim 11, delete "minor" and insert -- mirror --.

Signed and Sealed this
Fifth Day of July, 2016

Michelle K. Lee
*Director of the United States Patent and Trademark Office*